United States Patent [19]

Goodman

[11] 4,050,018

[45] Sept. 20, 1977

[54] CAPACITANCE METER BIAS PROTECTION CIRCUIT

[75] Inventor: Alvin Malcolm Goodman, Princeton, N.J.

[73] Assignee: RCA Corporation, New York, N.Y.

[21] Appl. No.: 680,075

[22] Filed: Apr. 26, 1976

[30] Foreign Application Priority Data

Sept. 24, 1975 United Kingdom ............... 39152/75

[51] Int. Cl.² .................... G01R 1/36; G01R 27/26
[52] U.S. Cl. .................................. 324/110; 324/60 C
[58] Field of Search .................. 324/110, 158 T, 60 C

[56] References Cited

U.S. PATENT DOCUMENTS 3,371,276  2/1968  Schiff ............................. 324/158 T Primary Examiner—Rudolph V. Rolinec
Assistant Examiner—Ernest F. Karlsen Attorney, Agent, or Firm—H. Christoffersen; Samuel Cohen; William Squire

[57] ABSTRACT

Capacitance is measured using a conventional meter while a DC bias voltage in a range from 0 to 10K volts is applied across the capacitance under test. An LC series resonant circuit is disposed between the capacitance under test and one input of the capacitance meter to provide a low impedance path for the 1 MHz test signal produced by the capacitance meter. P-I-N diodes are disposed across the input terminals of the capacitance meter to shunt the discharged energy from the resonant circuit capacitance should the capacitor under test short circuit. A resistance is in series with the resonant circuit to provide a voltage divider to lower the voltage appearing across the capacitance-meter input terminals to a value below the damage-threshold voltage level of the capacitance-meter.

7 Claims, 1 Drawing Figure

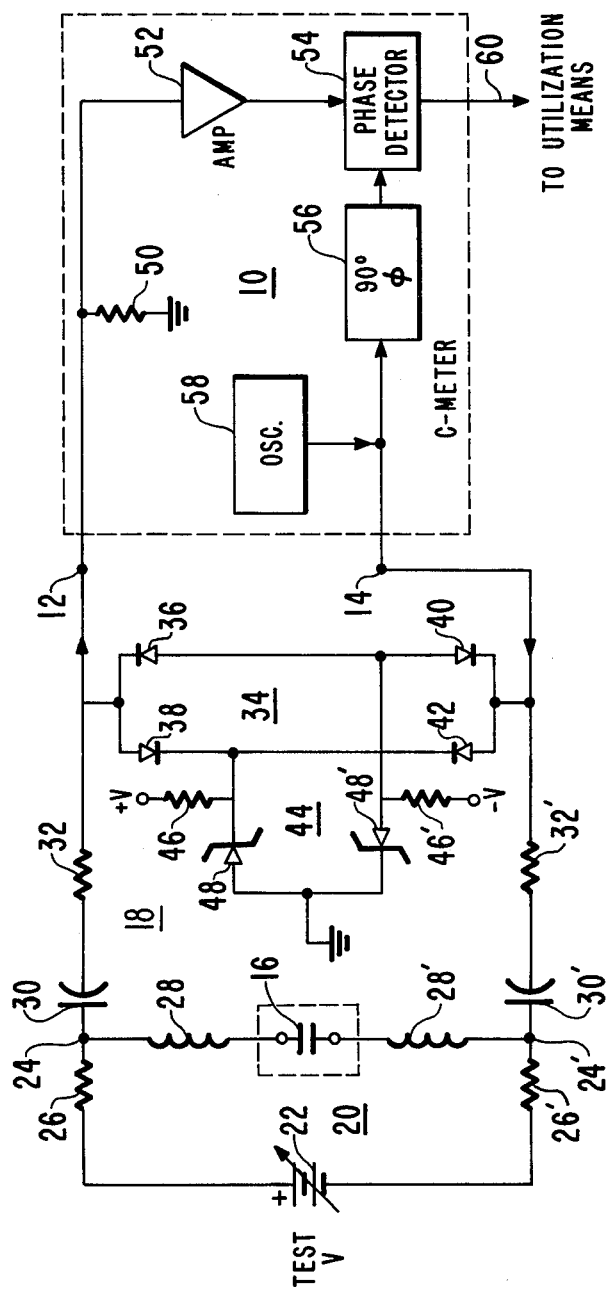

CAPACITANCE METER BIAS PROTECTION CIRCUIT

BACKGROUND OF THE INVENTION

The present invention relates to a protective circuit for a capacitance measuring instrument for measuring small signal differential capacitances as a function of an applied quasi-DC bias voltage.

Cross Reference

Article: A Useful Modification of the Technique for Measuring Capacitance as a Function of Voltage, Alvin M. Goodman, IEEE Transactions on Electron Devices, December 1974, 753–757.

Description of the Prior Art

The cross referenced article describes the measurement of small signal capacitances as a function of applied bias voltage for determining information about metal-insulator-semiconductor (MIS) capacitors. Described therein is a circuit modification which allows bias voltages of up to ±7 KV to be applied to a sample under test. Commercially available C-meters (capacitance meters) typically have applied bias capabilities of about ±600 volts or less. As shown in the above-noted article an isolation box is provided for the C-meter which includes a DC blocking capacitor for isolating the DC-bias voltage from the C-meter. However, when high DC voltages, for example, 7 to 10 K volts are applied across the capacitance being measured it is clear that a short circuit occurring in the capacitance under test will result in the DC blocking capacitor discharging through the C-meter thereby damaging the components therein.

SUMMARY OF THE INVENTION

A protective circuit is provided for a capacitance measuring device of the type having a pair of input terminals between which an alternating voltage signal of a given frequency is applied. The device includes a phase detecting means for generating as an output thereof a signal having a level proportional to the magnitude of the quadrature component of the alternating current signal determined by a test capacitance to be measured in response to the alternating voltage signal applied thereacross. The capacitance to be measured is biased with a DC voltage and is coupled between the pair of input terminals. The measuring device further includes an element tending to be damaged should the test capacitance short circuit when biased with the DC voltage. The protective circuit includes first and second terminals for receiving the DC bias voltage. Means are provided for connecting the test capacitance between the first and second terminals. An LC circuit is connected to the first terminal and comprises a resistance, a DC voltage blocking capacitance and an inductance. The capacitance and inductance form a series resonant circuit having a resonance at the given frequency for passing the alternating current signal between the test capacitance and one of the input terminals. Semiconductor switching means are provided connected across the series circuit and the connecting means and are arranged to be connected between the input terminals. The switching means have a high impedance and low conductance in one state and a low impedance, high conductance in a second state. The switching means switch from the one state to the second state in response to the blocking capacitance discharging upon the occurrence of a short circuit in the test capacitance.

BRIEF DESCRIPTION OF THE DRAWING

In the sole FIGURE, a schematic diagram is shown illustrating a preferred embodiment of an apparatus constructed and operated in accordance with the present invention.

DETAILED DESCRIPTION OF THE PREFERRED EMBODIMENT

In the drawing, capacitance meter (C-Meter) 10 has a pair of input terminals 12 and 14. Capacitance 16 to be measured is connected between terminals 12 and 14 by way of protective circuit 18. A DC biasing-voltage circuit 20 is connected across capacitance 16 to apply a DC bias voltage in a range from 0 to ±10 K volts. Device 16 may be, for example, an MIS capacitor whose capacitance is a function of the applied DC bias voltage from circuitry 20. The capacitance as a function of voltage can be used to derive information about the interface properties of the IS (insulator-semiconductor) interface and the doping of the underlying semiconductor. This investigative technique is known as the MIS capacitance method. The DC bias voltage circuitry 20 includes variable high DC voltage source 22 having its positive terminal connected to junction 24 through a current-limiting resistance 26. The negative terminal of source 22 is connected to junction 24' through current limiting resistance 26'.

Bias protection circuitry 18 includes a series resonant circuit comprising inductance 28 and capacitance 30 connected through resistance 32 to terminal 12. Junction 24 is connected between capacitance 30 and inductance 28. The other side of capacitance 16 is connected to terminal 14 through a like series resonant circuit comprising inductance 28', capacitance 30' and resistance 32'. Inductance 28', capacitance 30' and resistance 32' are of like value and mirror image of inductance 28, capacitance 30 and resistance 32. Connected between terminals 12 and 14 is a diode short circuit protection circuit 34. Circuit 34 includes P-I-N diodes 36, 38, 40 and 42. The anodes of diodes 36 and 40 are connected together while the cathodes are respectively connected to terminals 12 and 14. The cathodes of diodes 38 and 42 are connected together, while the anodes are respectively connected to the terminals 12 and 14. A reverse bias circuit 44 is connected to the diodes 36–42 to apply, for example, a 6.8 volt reverse bias to the P-I-N diodes. A source of positive bias voltage, for example, 15V, is connected through a current-limiting resistance 46 to the cathodes of diodes 38 and 42 and through a Zener diode 48 to ground, the cathode of the Zener diode 48 being connected to the cathodes of diodes 38 and 42. A second Zener diode 48' has its cathode connected to ground and its anode connected to the anode of diodes 36 and 40 and to a source of negative bias voltage, for example, −15V, through current-limiting resistance 46'.

Capacitance meter 10 includes a resistance 50 or an equivalent circuit connected between terminal 12 and a reference potential, e.g., ground. By equivalent circuit is meant that resistance 50 in some C-meters, in practice, represents a more complex arrangement of circuit components. Resistance 50 is a resistance which defines the scale of the C-meter 10 and can have a value from a fraction of an ohm to several kilo ohms. Resistance 50 has a value $R << 1/\omega C_s$ where $\omega$ is $2\pi$ times the measurement frequency and $C_s$ is the value of the capitance 16 under test. The value of resistance 50 determines the input impedance of the C-meter. Terminal 12 is connected to one input of phase detector 54 through an amplifier 52 and terminal 14 is connected through 90° phase shifter 56 to a second input of detector 54. A 1 MHz oscillator 58 has its output connected to terminal 14. The C-meter 10 is a commercially-available unit. Phase detector 54 provides an output signal at output 60 which represents the magnitude of the quadrature current passed by capacitance 16. Since the magnitude of the voltage with respect to ground at terminal 14 is a constant, the magnitude of the quadrature current is directly proportional to the measured capacitance. The operation of the C-meter 10 is well known and need not be further described herein.

The values of inductance 28 and capacitance 30 and identical inductance 28' and capacitance 30' are determined to provide a circuit that resonates at 1 MHz corresponding to the frequency of oscillator 58. Diodes 36–42 exhibit fast switching action in a period of the order of 10 nanoseconds. The reverse bias provided by circuit 44 insures diodes 36, 40, 42, and 38 are in the high impedance/low conductance state when in the OFF condition. Circuit 44 provides a low impedance path to ground when the diodes 36–42 are switched into the ON state in the presence of a high voltage signal at terminals 12 or 14 short circuiting the high voltage signal stored by capacitance 30 to ground prior to the destructive failure of resistance 50 or other components in C-meter 10.

In operation, when the voltage in circuit 20 is varied, suitable utilization means connected to the output lead 60 of C-meter 10 provides a record of the capacitance 16 versus the voltage at source 22. This provides information about the capacitance 16 in the well known MIS capacitance technique. Should the capacitance 16 exhibit a short circuit, the energy stored in capacitances 30 and 30' tends to discharge immediately. Without the presence of the diode circuit 34, the discharge path would be through the internal components of C-meter 10 thus causing the damage of one or more of those components. The presence of the diode circuit 34 is such that the high voltage discharge of capacitance 30 and 30' quickly turns on the diode circuit 34, switching the transient discharge current to ground through Zener diodes 48 and 48'.

A problem arises with capacitance 30 if it were not for the tuned circuit provided by inductance 28 in combination with capacitance 30. Ordinarily, the capacitance 30, to pass the high frequency 1 MHz signal produced by oscillator 58 would have a relatively high value. For example, capacitance 30 would have to be at least two orders of magnitude greater than the largest value to be measured in order to maintain less than 1% error. In the absence of inductors 28 and 28' and naturally occurring inductance in the circuit wiring, the C-meter would measure the series equivalent capacitance of the test sample and capacitances 30 and 30'. This high value would tend to store a large amount of energy. Upon the occurrence of a short circuit in the capacitance 16, capacitance 30 would discharge through the diode circuit 34 and would tend to destroy one or more of the diodes 36–42. To prevent such action, inductance 28 is combined with a relatively small capacitance 30 to form a tuned series resonant circuit. Thus capacitance 30 serves a double function in that it also serves as a DC blocking capacitor for the DC voltage from source 22.

In froming a tuned circuit, the capacitance 30 has a relatively low value, for example 0.002 microfarads, which when discharged by the occurrence of a short circuit in capacitance 16, produces an energy pulse insufficient to destructively fail any of the diodes 36–42. The tuning of capacitance 30 and inductance 28 to the frequency of oscillator 58 provides a low impedance path for the 1 MHz signal from the capacitance 16 to terminal 12. Inductance 28', capacitance 30' serve a like function, providing a low impedance path for the 1 MHz signal from the oscillator 58 to the capacitance 16.

Resistance 32 serves as a voltage divider in conjunction with the resistance of the diode circuit 34. The value of resistance 32 is preferably about 25 ohms as determined by the maximum DC voltage from source 20 and the type of components in circuit 34. For example, the value of resistance 32 could be less with lower DC bias voltage. Assuming the resistance of circuit 34 of about 1 ohm then it is apparent that the maximum transient voltage appearing from either terminal 12 or 14 to ground is less than about ±200 V assuring safe operation for the internal components of C-meter 10. The value of resistance 32 is important. If the resistance 32 is made too great it reduces the accuracy of the measurement of capacitance 16 by C-meter 10. It can be shown that the accuracy of measurement of C-meter 10 is related to the value of resistance 32. This value, of course, is taken in conjunction with the value of internal resistance 50 of the meter 10. If the value of resistance 32 is made too low, then too great a voltage will appear across terminals 12 and 14, causing damage to the internal components of C-meter 10. Thus, a relatively narrow range of resistances for resistance 32 is suitable to provide a wide range of measurement capability. The value of resistance 32' is made identical with the value of resistance 32.

To reduce the voltage appearing at C-meter input terminals 12 and 14 upon the occurrence of a short circuit in capacitance 16, two mirror networks are provided across source 22, the mirror networks include resistance 26, inductance 28, capacitance 30, resistance 32, diodes 36, 38 and 48, and resistance 46, which are indentical in value to the like primed components on the other side of capacitance 16. The mirror image effect in essence reduces the value of the voltage appearing at capacitances 30, 30' to one half of the amplitude of the voltage a source 22. It is to be understood that resistance 32', inductance 28' and capacitance 30' may be eliminated where lower voltages at source 22 are desired. This puts a constraint on source 22. If it is desired that source 22 be grounded, it must be grounded at the junction with resistance 26'.

While a P-I-N diode configuration is preferred for diodes 36–42, this configuration is desirable where the impedance presented by C-meter 10 is relatively high, for example, about several hundred ohms. To provide a maximum error of 1%, the resistance presented by the diode circuit 34 must be at least 100 times greater than the C-meter input resistance. In this instance, ordinary diodes do not have a sufficiently low enough conductance or high enough resistance in the reverse-biased condition (off-state) combined with the required power handling capability to meet this requirement. The lower input-impedance C-meters may be operative without excessive error with the ordinary diodes since in that case a higher conductance in circuit 34 can be tolerated. The P-I-N diodes are preferred since they do not load the circuitry of the C-meter due to their shunt capacitance and conductance in the OFF-state. Even P-I-N diodes have a small value of conductance and capacitance when in reverse bias. This may have some effect when the value of internal impedance such as resistance 50 of the C-meter 10 is at the high end of the scale, in the order of greater than ≃ 1,000 ohms.

What is claimed is:

1. In a circuit for measuring the capacitance between first and second terminals between which an element to be tested is placed and which includes means for producing a test signal at a given frequency to be applied between said terminals, means for producing a direct voltage to be applied between said terminals, and means for measuring the quadrature component of said test signal produced by said element in response to the test signal and direct voltage, a protection circuit comprising, in combination:

third and fourth terminals between which said direct voltage is applied;

a series circuit between said third and fourth terminals comprising inductive means in series with said first and second terminals;

fifth and sixth terminals between which said test signal is applied;

a circuit resonant at said test signal frequency connected between said first and sixth terminals including, in series between said third and fifth terminals a direct voltage blocking capacitance and resistance means, said resonant circuit including also said inductive means, and semiconductor switching means normally exhibiting a relatively high impedance connected between said fifth and sixth terminals and responsive to a short circuit appearing between said first and second terminals for exhibiting a relatively low impedance to permit discharge of said direct voltage blocking capacitance.

2. The circuit of claim 1, wherein said switching means includes first and second diodes the anode of one diode being connected to the cathode of the other diode.

3. The circuit of claim 2, wherein said diodes are P-I-N semiconductor devices.

4. The circuit of claim 1 wherein said switching means includes first, second, third and fourth diodes the anodes of said first and second diodes being connected together and the cathodes of said third and fourth diodes being connected together, the cathode of said first diode and anode of said third diode being connected to one of said series circuits, the cathode of said second diode and anode of said fourth diode being connected to the other of said series circuits, and reverse bias means connected to each said diodes.

5. The circuit of claim 4 wherein said reverse bias means includes potential limiting means connected between a reference potential and the cathodes of said third and fourth diodes and anodes of said first and second diodes.

6. The circuit of claim 1 wherein said element tends to be damaged when the voltage across said input terminals exceeds a given value, said resistance and said switching means forming a voltage dividing network for limiting the voltage across said switching means to a value less than said given value.

7. In the circuit of claim 5, said circuit resonant at said test signal frequency connected between said fifth and sixth terminals further including, in series between said fourth and sixth terminals, a second direct voltage blocking capacitance and a second resistance means.

* * * * *